United States Patent
Berthold et al.

[11] Patent Number: 5,973,965
[45] Date of Patent: Oct. 26, 1999

[54] METHOD FOR OPERATING A SRAM MOS TRANSISTOR MEMORY CELL

[75] Inventors: Jörg Berthold, München; Jürgen Dresel, Vaihingen/Enz, both of Germany

[73] Assignee: Siemens Aktiengesellschaft, Munich, Germany

[21] Appl. No.: 09/091,713
[22] PCT Filed: Dec. 12, 1996
[86] PCT No.: PCT/DE96/02394
§ 371 Date: Jun. 22, 1998
§ 102(e) Date: Jun. 22, 1998
[87] PCT Pub. No.: WO97/23878
PCT Pub. Date: Jul. 3, 1997

[30] Foreign Application Priority Data

Dec. 21, 1995 [DE] Germany .......................... 195 48 053

[51] Int. Cl.[6] .............................. G11C 7/00; G11C 11/00
[52] U.S. Cl. .................... 365/188; 365/177; 365/189.01; 365/226
[58] Field of Search .............................. 365/230, 189.01, 365/221, 222, 188, 177, 226

[56] References Cited

U.S. PATENT DOCUMENTS

| | | |
|---|---|---|
| 4,845,676 | 7/1989 | Lohlein et al. . |
| 5,040,146 | 8/1991 | Mattausch et al. . |
| 5,544,109 | 8/1996 | Uchida et al. ...................... 365/189.11 |
| 5,715,191 | 2/1998 | Yamanchi et al. ...................... 365/156 |
| 5,726,882 | 3/1998 | Miyamoto et al. ................ 365/185.22 |

FOREIGN PATENT DOCUMENTS 8329681 12/1996 Japan .

OTHER PUBLICATIONS

IEEE Journal Of Solid–State Circuits, vol. 27, No. 4, Apr. 1992—Low–Power CMOS Digital Design.

Rhein/Freitag Mikroelektronische Speicher 4 Schreib 4 Schreib–Lese–Speicherschaltkreise (RAM) ISB.

700 IBM Technical Disclosure Bulletin 31 (1988), Jun., No. 1, Armonk, NY, USA.

Primary Examiner—Viet Q. Nguyen
Attorney, Agent, or Firm—Hill & Simpson

[57] ABSTRACT

In a method for operating an SRAM MOS transistor memory cell, the memory cell comprises a 6-transistor memory cell composed of two inverters with feedback, each of which is connected to a bit line via a selection transistor which is driven by a word line. Both selection transistors are switched on when writing information to the memory cell. Only the first selection transistor is switched on, the other selection transistor remaining switched off, when reading the contents of the cell. In this way, the charge on only one bit line is changed when reading.

3 Claims, 3 Drawing Sheets

METHOD FOR OPERATING A SRAM MOS TRANSISTOR MEMORY CELL

BACKGROUND OF THE INVENTION

Microelectronic circuits for data and/or signal processing contain memories with memory cells which make it possible to store data, state variables etc. The requirements for these memories have become more stringent as processing speed increases. In particular, it has been necessary to shorten considerably both the access time to the contents of the memory (read process) and the time period for writing to the memory (write process). An important example of such memories is the SRAM (Static Random Access Memory) which can be implemented with a small area requirement and allows very rapid access to its content.

An increasing number of portable systems have come on the market recently, such as mobile telephones, palm-top computers and medical equipment (e.g. hearing aids) for example. The voltage supply for these systems is provided by batteries or rechargeable batteries. The operating time and standby time of portable equipment in this case depends on the one hand on the battery capacity and on the other hand on the power consumption of the system components. In the case of microelectronic circuits, concepts for reducing the power consumption have already been developed, in order to increase the standby time in this way. See A. P. Chandrakasan, S. Sheng, R. W. Brodersen: "Low-Power CMOS Digital Design", IEEE Journal of Solid-State Circuits, Vol. 27, No. 4, April 1992, pp. 473–484.

The power consumption of microelectronic circuits can essentially be described by the following relationship:

$$P\sigma\left(\sum_i \sigma i \cdot Ci\right) \cdot VDD \cdot HUB \tag{I}$$

where $\sigma_i$ is the switching frequency of the i-th node, $C_i$ is its capacitance, VDD represents the supply voltage, HUB the level change at a node (HUB=VDD in general in static CMOS logic), and i is a sequential number for all the nodes in the relevant circuit.

The following techniques for power reduction can be derived from Equation (1): lowering the supply voltage, reducing node capacitances and reducing switching frequencies.

In the case of a SRAM memory, circuits have been implemented whose power consumption has already been considerably reduced by means of the techniques mentioned above: lowering the supply voltage from 5 volts to 3.3 volts (in some cases 2.4 V), precharging the bit lines to VDD/2 instead of VDD (level reduction), minimizing the capacitance by means of a compact layout (that is to say small number of transistors and small wiring capacitances), and by dividing the memory into blocks which can thus be driven individually (that is to say reduced switching frequency).

A 6-transistor memory cell is known from D. Rhein, H. Freitag: "Mikroelektronische Speicher", Springer Press 1992, pp 50–51, 56–57, and is also illustrated in FIG. 2. The memory cell SZ comprises two inverters MN5, MP3 and MN6, MP4 with feedback. The output node A of the inverter MN5, MP3 is connected to a first bit line BL via a first selection transistor MN1 which is driven via a word line WL. The output node B of the inverter MN6, MP4 is connected to a second bit line BLQ via a second selection transistor MN2 which is likewise driven by the word line WL. The corresponding transistors in the two inverters have the same dimensions, that is to say MP3=MP4 and MN5=MN6.

An important feature of a SRAM, designed with the described 6-transistor memory cell (FIG. 2) and differentially operating read amplifiers (see Rhein, supra), is the fact that the bit lines are driven in pairs. During writing, mutually complementary levels (for example BL=1 and BLQ=0) are applied to BL and BLQ corresponding to the datum and only then can the inverter pair (comprising MN5, MN6, MP3 and MP4) with feedback be switched over (A from 0 to 1; B from 1 to 0) via the selection transistors MN1 and MN2, which are switched on by WL. At the start of a reading process, both nodes BL and BLQ are at the same potential in order that they can then be drawn to mutually complementary levels by a driven memory cell (MN1 and MN2 are switched on by WL). A differentially operating read amplifier then allows rapid assessment of the difference between BL and BLQ, and thus reliable reading.

The capacitances of the bit lines BL and BLQ are governed both by the capacitive load of a cell and by the architecture of the memory, and in general they are among the largest capacitances in a SRAM. Since one of the large bit line capacitances must be reversed ($\sigma BL=0.5$, $\sigma BLQ=0.5$, see Formula (1)) in each case both during the reading process and during the writing process depending on the driven memory cell, a large proportion of the power consumption of a SRAM is caused at this point.

Any reduction in the switching frequency of bit lines can accordingly lead to a considerable reduction in the SRAM power consumption.

A 6-transistor memory cell is known from IBM Technical Disclosure Bulletin Vol. 31, No. 1 June 1988, page 291, and is also illustrated in FIG. 1. The memory cell SZ comprises a memory element SPE composed of two inverters MN5, MP3 and MN6, MP4 of different dimensions and with feedback. The output node A of the weaker inverter MN5, MP3 is connected to a first bit line BL via a first selection transistor MN1 which is driven via a word line WL. The output node B of the stronger inverter MN6, MP4 is connected to a second bit line BLQ via a second selection transistor MN2 which is driven by a second word line WLS.

In the case of the known circuit, the word line WL is used for writing a bit, and the second word line WLS is used for reading a bit from the memory element SPE using a single-pole read amplifier. VDD and VSS are supply voltages. When reading from this SRAM cell, only the bit line BL experiences a level change, and only the bit line BLQ during writing. It has thus been possible to reduce considerably the switching frequency of the bit lines.

If the supply voltage VDD is lowered to $$|Vthmax| < VDD < |Vthp| + |Vthn| \tag{2}$$

(Vthp, Vthn: threshold voltage of the N(P)-channel transistors, Vthmax being the greater value of Vthp and Vthn) in order to reduce the power consumption, the operation of the memory cell according to IBM, supra, (FIG. 1) is not ensured. When writing a 1 (BL=VDD), the charge on the node A is changed only to V=VDD−Vthn, since a voltage drop ΔV of ΔV=Vthn occurs across the selection transistor MN1. The inverter comprising MP4 and MN6 cannot switch over with this voltage level at the node A, and storage therefore does not take place. It is not possible to use the memory cell according to IBM, supra, (FIG. 1) in the voltage range according to Rhein, supra.

SUMMARY OF THE INVENTION

An object of the invention is to specify the operation of a SRAM architecture which comprises memory cells according to FIG. 1 and with the aid of which the switching activity on the bit lines is kept as low as possible, while at the same time ensuring operation at low supply voltages.

This problem is solved by a method according to the invention for operating an SRAM MOS transistor memory cell wherein a memory element is formed of an inverter pair with feedback. A first selection transistor is connected for control by a first word line and a first connecting node of the first inverter is connected through the first selection transistor to a first bit line. A second selection transistor is connected for control by a second word line and a second connecting node of the second inverter is connected through the second selection transistor to a second bit line. Both selection transistors are switched on when writing information to the memory element. The first selection transistor is switched on with the second selection transistor remaining switched off when reading a content of the memory element.

The invention will be explained in more detail with reference to the drawing figures.

DESCRIPTION OF THE PREFERRED EMBODIMENTS

Figure 1:
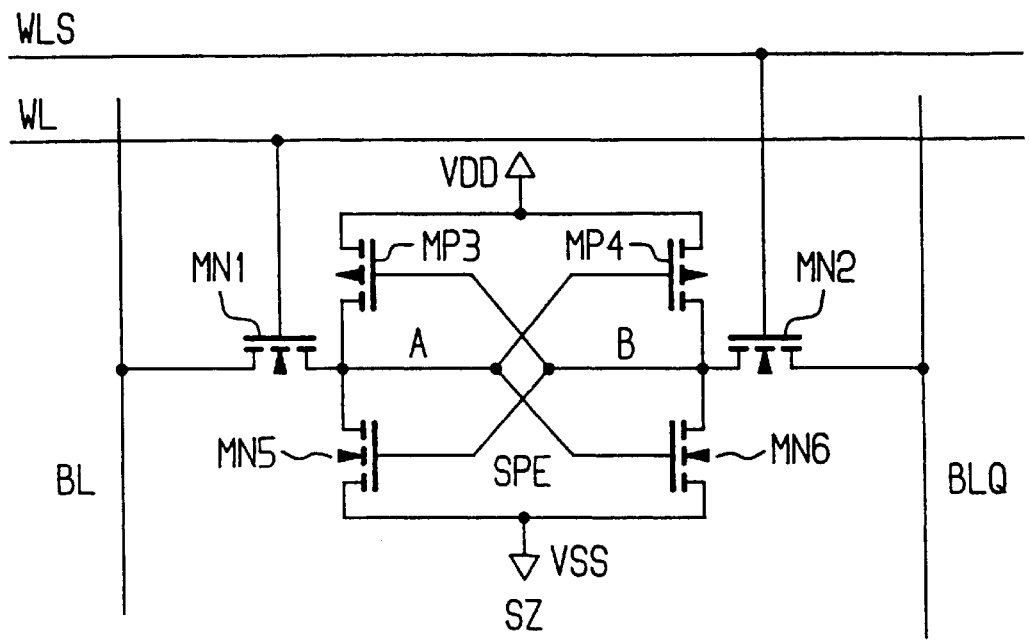
FIGS. 1, 2 show the memory cells already mentioned.
Figure 2:
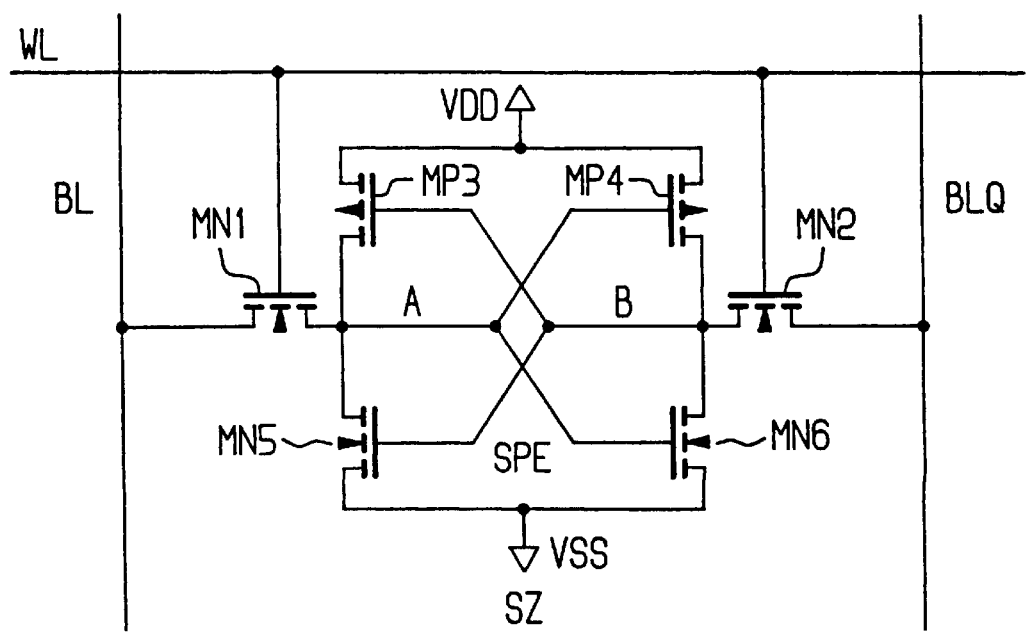
Figure 3:
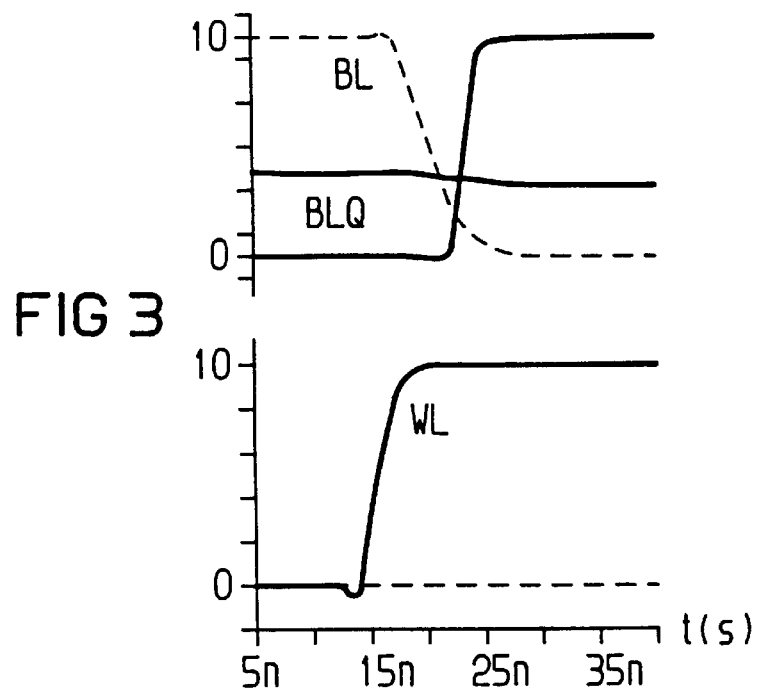
FIG. 3 shows a diagram which illustrates the voltage relationships during the reading process.

The SRAM cell illustrated in FIG. 1 is driven by the two word lines WLS and WL. During the reading process, only WL is active as in IBM, supra, the transistor MN1 being switched on. If a zero is stored (A=0, B=1), the bit line BL which is precharged to 1 is drawn to 0. If a 1 is stored in the cell (A=VDD, B=0), BL remains at the precharging potential. The bit line BLQ does not experience any level change throughout the entire reading process for either value. During the reading process, the switching frequency of the bit lines BL and BLQ is therefore σBL=0.5 and, respectively, σBLQ=0, that is to say the switching frequency of BLQ has been reduced to 0 in comparison with σBLQ=0.5 for a SRAM cell (FIG. 2) driven by one word line WL. FIG. 3 shows the result of a simulation of the process when reading a 0. The charge on WL is changed to 1 by a row decoder (WLS remains at 0), as a result of which BL is drawn to 0 by the cell.

As a consequence, the charge at the output LS of a single-pole read amplifier, in this case a static, CMOS inverter, is changed to 1.

Figure 4:
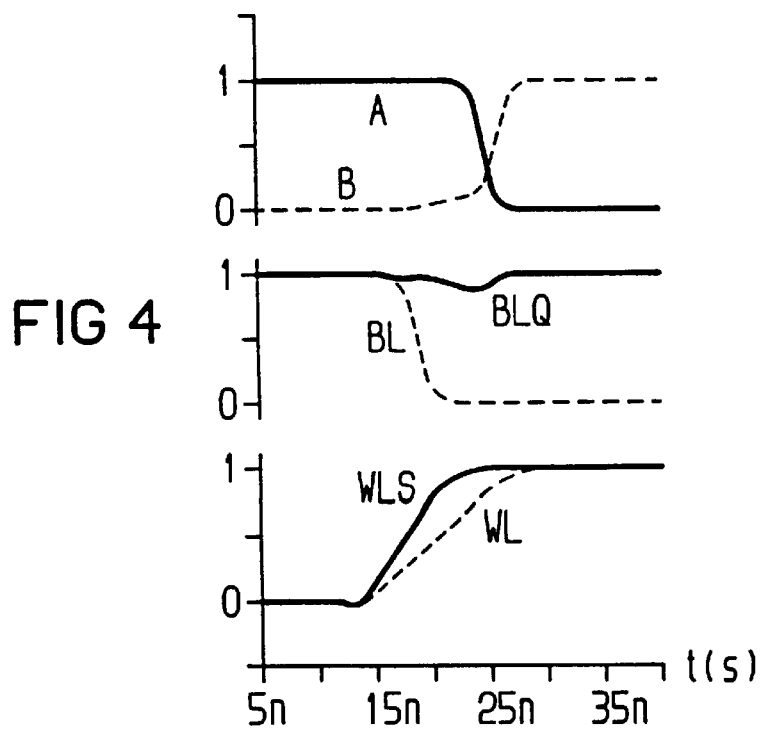
FIG. 4 shows a diagram which illustrates the voltage relationships during the writing process.

During the writing process (FIG. 4) the row decoder applies VDD to both word lines WL and WLS in contrast to IBM, supra. The datum is applied to the bit lines at complementary levels (for example BL=VSS, BLQ=VDD). In consequence, the state of the inverter pair with feedback and the potential at the node A change alternately from VDD to VSS (B from VSS to VDD). A zero has thus been written in the memory cell (the previous content was a one).

Figure 5:
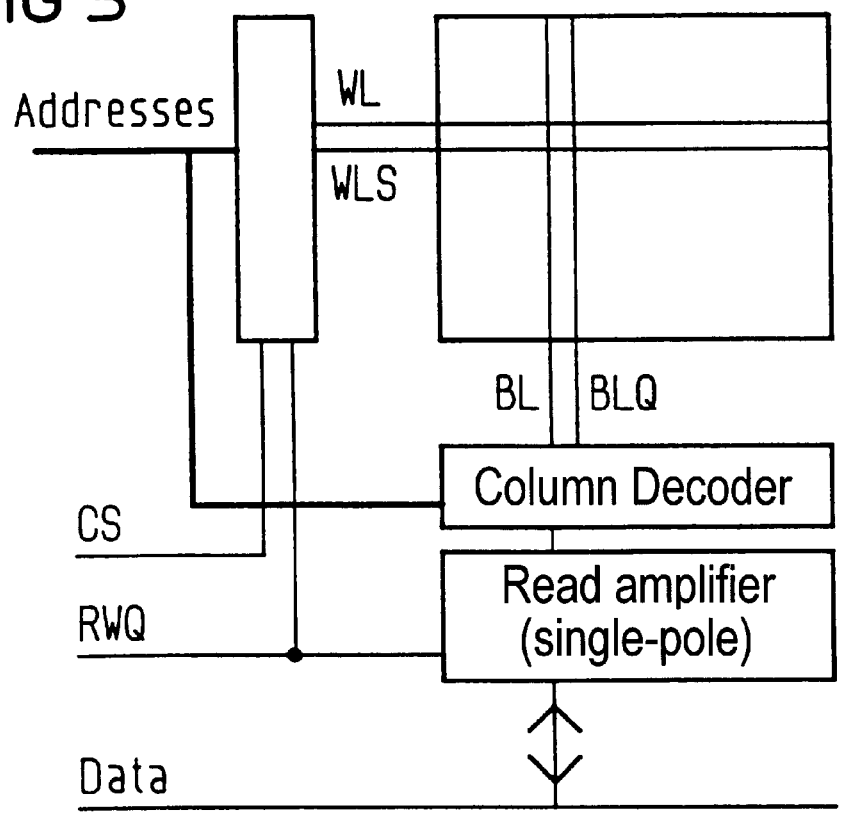
FIG. 5 shows one version of the memory.

FIG. 5 illustrates schematically the SRAM architecture corresponding to the proposed version. The write/read signal RWQ must be supplied to the row decoder ZD in the SRAM architecture. SD designates a column decoder, LV a single-pole read amplifier, CS a chip-select signal and SP a memory matrix.

Figure 6:
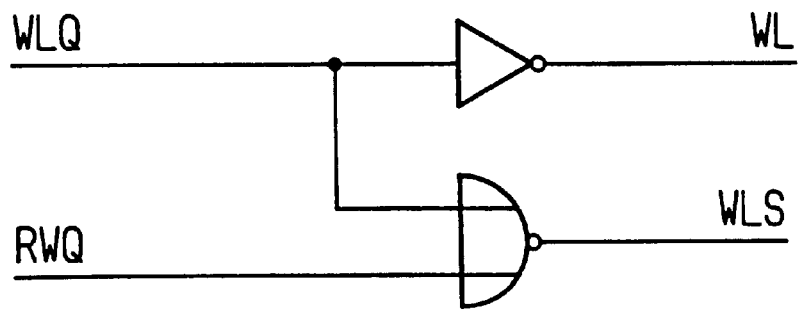
FIG. 6 shows a row decoder.

FIG. 6 shows an implementation of the modified row decoder ZD. The figure is self-evident.

Although various minor changes and modifications might be proposed by those skilled in the art, it will be understood that our wish is to include within the claims of the patent warranted hereon all such changes and modifications as reasonably come within our contribution to the art.

We claim as our invention:

1. A method for operating an SRAM MOS transistor memory cell, comprising the steps of:
   forming a memory element of an inverter pair with feedback;
   connecting a first selection transistor for control by a first word line and connecting a first connecting node of the first inverter through the first selection transistor to a first bit line;
   connecting a second selection transistor for control by a second word line and connecting a second connecting node of the second inverter through the second selection transistor to a second bit line;
   switching on both selection transistors when writing information to the memory element; and
   switching on the first selection transistor with the second selection transistor remaining switched off when reading a content of the memory element.

2. The method according to claim 1 wherein a supply voltage VDD of the memory cell is set in a range $$|Vthmax|<VDD<|Vthp|+|Vthn|$$

where $|Vthp|$ and $|Vthn|$ are magnitudes of threshold voltages of the transistors, and $|Vthmax|$ is a greater of $|Vthp|$ and $|Vthn|$.

3. A method for operating a transistor memory cell, comprising the steps of:
   forming a memory element of an inverter pair with feedback, each inverter having first and second transistors;
   connecting a gate of a first selection transistor to a first word line and connecting a first node between the first and second transistors of the first inverter through the first selection transistor to a first bit line;
   connecting a gate of a second selection transistor to a second word line and connecting a second node between the first and second transistors of the second inverter through the second selection transistor to a second bit line;
   switching on both selection transistors when writing information to the memory element; and
   switching on the first selection transistor with the second selection transistor remaining switched off when reading a content of the memory element.

* * * * *